United States Patent
Lin et al.

(10) Patent No.: US 12,089,345 B2
(45) Date of Patent: Sep. 10, 2024

(54) MANUFACTURING METHOD OF ELECTRONIC DEVICE

(71) Applicant: Innolux Corporation, Miao-Li County (TW)

(72) Inventors: Yi-Hung Lin, Miao-Li County (TW); Hsiu-Yi Tsai, Miao-Li County (TW); Chin-Lung Ting, Miao-Li County (TW); Chung-Kuang Wei, Miao-Li County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 17/742,415

(22) Filed: May 12, 2022

(65) Prior Publication Data

US 2022/0386475 A1    Dec. 1, 2022

Related U.S. Application Data

(60) Provisional application No. 63/195,183, filed on Jun. 1, 2021.

(30) Foreign Application Priority Data

Apr. 12, 2022  (CN) .......................... 202210380860.7

(51) Int. Cl.
*H01S 4/00*    (2006.01)
*H05K 1/02*    (2006.01)
*H05K 3/32*    (2006.01)

(52) U.S. Cl.
CPC ............. *H05K 3/32* (2013.01); *H05K 1/0268* (2013.01); *H05K 2201/10015* (2013.01); *H05K 2201/10106* (2013.01); *H05K 2203/16* (2013.01)

(58) Field of Classification Search
CPC ................... H05K 3/32; H05K 1/0268; H05K 2201/10015; H05K 2201/10106; H05K 2203/16

See application file for complete search history.

(56) References Cited

U.S. PATENT DOCUMENTS 9,980,341 B2 *  5/2018  Bower .................. H05B 45/20
2003/0049871 A1  3/2003  Higashi
(Continued)

FOREIGN PATENT DOCUMENTS

TW    M499559    4/2015

OTHER PUBLICATIONS

"Partial Search Report of Europe Counterpart Application", issued on Nov. 7, 2022, p. 1-p. 13.
(Continued)

*Primary Examiner* — Paul D Kim
(74) *Attorney, Agent, or Firm* — JCIPRNET

(57) ABSTRACT

A manufacturing method of an electronic device is provided. The manufacturing method of the electronic device includes following steps: providing a substrate; bonding at least one electronic component to the substrate, wherein the at least one electronic component is mainly driven by a reverse bias in an operating mode; applying a forward bias to the at least one electronic component, and determining whether the at least one electronic component is normal or failed; and transporting the substrate configured with the at least one electronic component determined to be normal to a next production site or repairing the at least one electronic component determined to be failed.

17 Claims, 7 Drawing Sheets

(56) References Cited

U.S. PATENT DOCUMENTS

| | | |
|---|---|---|
| 2008/0012651 A1 | 1/2008 | Nakamura |
| 2015/0262897 A1 | 9/2015 | Chen et al. |
| 2017/0278760 A1 | 9/2017 | Chen et al. |
| 2017/0338159 A1 | 11/2017 | Ishii et al. |
| 2018/0007750 A1* | 1/2018 | Meitl ...................... H01L 22/24 |

OTHER PUBLICATIONS

"Office Action of Taiwan Counterpart Application", issued on Apr. 24, 2023, p. 1-p. 7.
"Search Report of Europe Counterpart Application", issued on Mar. 2, 2023, p. 1-p. 13.

* cited by examiner

MANUFACTURING METHOD OF ELECTRONIC DEVICE

CROSS-REFERENCE TO RELATED APPLICATION

This application claims the priority benefits of U.S. provisional application Ser. No. 63/195,183, filed on Jun. 1, 2021, and China application serial no. 202210380860.7, filed on Apr. 12, 2022. The entirety of each of the above-mentioned patent applications is hereby incorporated by reference herein.

BACKGROUND

Technical Field

The disclosure relates to a manufacturing method of an electronic device.

Description of Related Art

In existing electronic devices including variable capacitors, tests are performed to test whether the variable capacitors are normal or failed by applying a reverse bias to the variable capacitors after manufacturing. Test difficulty of existing variable capacitors bonded on a substrate is rather high. Moreover, the existing test is a product function test performed after the plurality of variable capacitors have been bonded to the substrate, which cannot locate a single failed variable capacitor.

SUMMARY

The disclosure is directed to a manufacturing method of an electronic device, which is adapted to automatically determine whether an electronic component in the electronic device is failed during a manufacturing process, so as to repair the electronic component determined to be failed during the manufacturing process.

According to an embodiment of the disclosure, the manufacturing method of the electronic device includes following steps. A substrate is provided. At least one electronic component is bonded to the substrate. The at least one electronic component is mainly driven by a reverse bias in an operating mode. A forward bias is applied to the at least one electronic component, and whether the at least one electronic component is normal or failed is determined. The substrate configured with the at least one electronic component determined to be normal is transported to a next production site or the at least one electronic component determined to be failed is repaired.

According to the above description, the manufacturing method of the electronic device of the disclosure may apply a forward bias to the electronic component and detect whether the electronic component emits light, so that a test device may be used to accurately and conveniently determine whether the electronic device is normal or failed.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
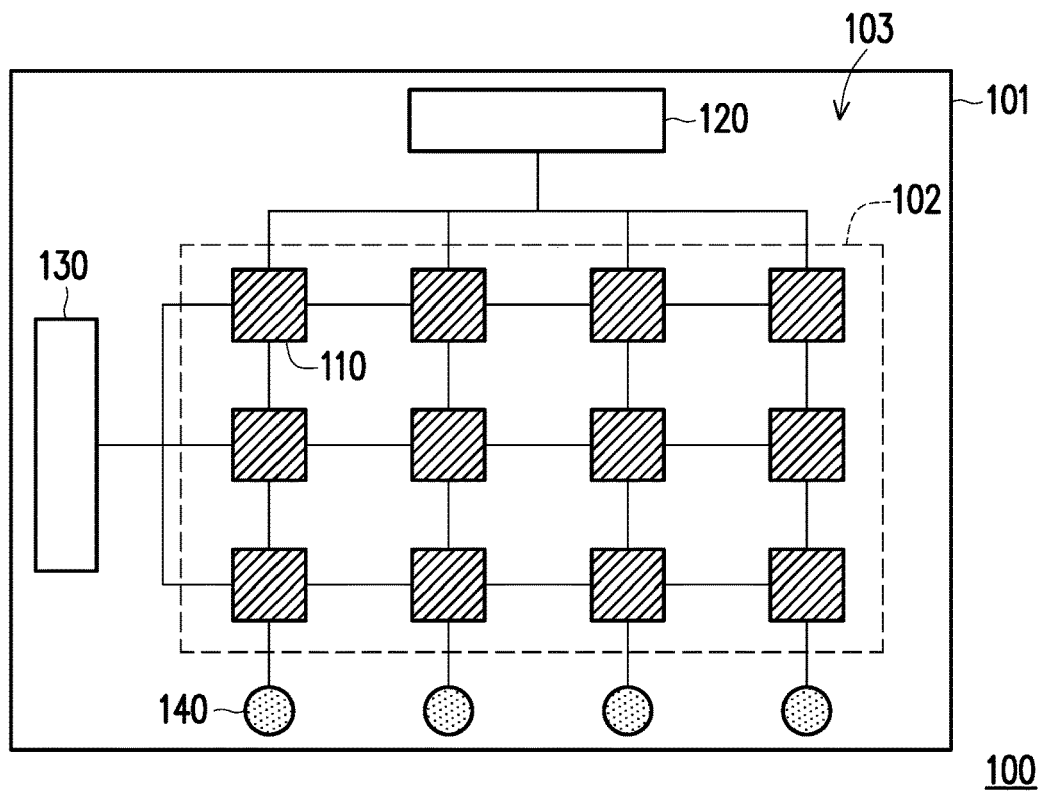
FIG. 1 is a schematic structural diagram of an electronic device according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Certain terms are used throughout the specification of the disclosure and the appended claims to refer to specific components. Those skilled in the art should understand that electronic device manufacturers may probably use different names to refer to the same components. This specification is not intended to distinguish between components that have the same function but different names. In the following specification and claims, the terms "including", "containing", "having", etc., are open terms, so that they should be interpreted as meaning of "including but not limited to . . . ".

In some embodiments of the disclosure, the terms "bonding" and "connecting", unless otherwise defined, may refer to direct contact of two structures, or may also refer to indirect contact of the two structures, and there are other structures provided between these two structures. In addition, the terms "bonding" and "connecting" may also include the case where both structures are movable, or both structures are fixed. In addition, the terms "electrically connected" and "coupled" include any direct and indirect means of electrical connection.

The ordinal numbers used in the specification and claims, such as "first", "second", etc., are used to modify components, and do not imply and represent the component or these components have any previous ordinal numbers, and do not represent a sequence of one component with another, or a sequence in a manufacturing method. The use of these ordinal numbers is only to make a clear distinction between a component with a certain name and another component with the same name. The same terms may not be used in the claims and the specification, and accordingly, a first component in the specification may be a second component in the claims. It should be noted that, in the following embodiments, the features of several different embodiments may be replaced, recombined, and mixed to complete other embodiments without departing from the spirit of the disclosure. As long as the features among the various embodiments do not violate the spirit of the disclosure or conflict with each other, the features may be arbitrarily mixed and matched.

FIG. 1 is a schematic structural diagram of an electronic device according to an embodiment of the disclosure. Referring to FIG. 1, FIG. 1 may be a top view of an electronic device 100. The electronic device 100 includes a substrate 101, a plurality of electronic components 110, driving circuits 120 and 130, and a plurality of test pads 140. In the embodiment, the plurality of electronic components 110 are disposed in an active area 102 of the substrate 101, and the driving circuits 120 and 130 and the plurality of test pads 140 are disposed in a peripheral area 103 outside the active area 102. In the embodiment, the plurality of electronic components 110 are arranged in the active area 102 of the substrate 101 in an array, and are electrically connected to the driving circuits 120 and 130 and the plurality of test pads 140 through a plurality of traces. In other embodiments, the plurality of electronic components 110 may also be arranged in the active area 102 of the substrate 101 in random arrangement and connection.

In the embodiment, the driving circuits 120 and 130 may be respectively disposed in the peripheral area of the substrate 101 and close to two adjacent side edges of the substrate 101, but the disclosure is not limited thereto. In an embodiment, the driving circuits 120 and 130 may also be respectively disposed at positions of two opposite side edges of the substrate 101 or at positions of a same side edge. In the embodiment, the plurality of test pads 140 may be disposed in the peripheral area of the substrate 101 and disposed at positions along a certain side edge different from that of the driving circuits 120 and 130, but the disclosure is not limited thereto. In one embodiment, the plurality of test pads 140 may also be disposed at positions along two side edges different from that of the driving circuits 120 and 130, or disposed at positions along a certain side edge or multiple side edges that are the same to that of the driving circuits 120 and 130.

In the embodiment, the electronic device 100 may be a tuning device, such as an antenna device, etc. The antenna device may include, for example, but not limited to, an antenna splicing device, but the disclosure is not limited thereto. In an embodiment, the electronic device 100 may be a display device, a sensing device, a touch display device, a curved display device, or a free shape display device, but the disclosure is not limited thereto. The antenna device may include, for example, but not limited to, an antenna splicing device. In addition, the substrate and the carrier according to the embodiments of the disclosure may be a circuit substrate, a glass substrate, a flexible substrate, etc.

In the embodiment, the plurality of electronic components 110 may include variable capacitors (or referred to as variable capacitance diodes/varicap diodes) and/or light-emitting diodes. In the embodiment, the driving circuits 120 and 130 may be respectively a source driving circuit and a gate driving circuit, and are used to drive the plurality of electronic components 110, but the disclosure is not limited thereto. In the embodiment, the plurality of test pads 140 may be used to test whether the plurality of electronic components 110 are normal or failed during a manufacturing process of the electronic device 100, so as to facilitate repairing the failed electronic components in the manufacturing process of the electronic device 100.

Figure 2:
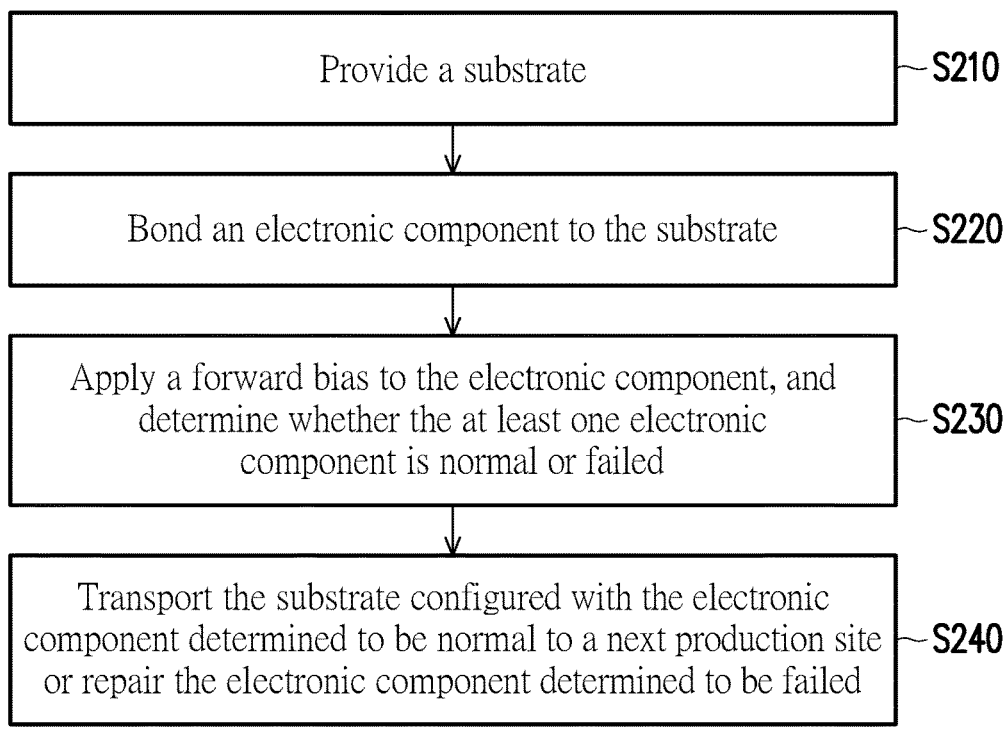
FIG. 2 is a flowchart of a manufacturing method of an electronic device according to an embodiment of the disclosure.

FIG. 2 is a flowchart of a manufacturing method of an electronic device according to an embodiment of the disclosure. Referring to FIG. 1 and FIG. 2, the electronic device 100 of FIG. 1 may be manufactured by performing following steps S210-S240. In step S210, the substrate 101 is provided. Circuit traces may be first formed on the substrate 101. In step S220, (at least one) electronic component 110 is bonded on the substrate 101. Arrangement positions of the electronic components 110 on the substrate 101 may be determined based on the previously formed circuit traces. In the embodiment, the electronic component 110 may include a variable capacitor, and the variable capacitor of the electronic component 110 may be mainly driven by a reverse bias (or reverse current) in an operating mode (driven through signals provided by the driving circuits 120 and 130), so as to implement a capacitance modulation function through an electron depletion region of the variable capacitor.

In step S230, a forward bias (or forward current) is applied to the electronic component 110 through a test device, and it is determined whether the electronic component 110 is normal or failed. The test device may provide the forward bias to the variable capacitor of the electronic component 110 through the test pad 140, so that the variable capacitor may realize a diode function to emit light (an electromagnetic wave) having a specific wavelength (for example, 0.2-1000 micrometers (μm)). In the embodiment, whether the electronic component 110 emits light with a specific wavelength may be detected by a light detection component, so as to determine whether the variable capacitor of the electronic component 110 is normal or failed. The light having the specific wavelength is emitted from the variable capacitor. Alternatively, in an embodiment, an infrared imager may be used to detect whether the circuit traces and the variable capacitor of the electronic component 110 have normal thermal characteristics (heat distribution), so as to determine whether the variable capacitor of the electronic component 110 is normal or failed (including determining whether the variable capacitor and the circuit traces are normally electrically connected).

In step S240, the substrate 101 configured with the electronic component determined to be normal is transported, or the electronic component determined to be failed is repaired. In this regard, when it is determined that there are failed electronic components, the manufacturing personnel or manufacturing equipment may be notified to replace or repair the failed electronic components. When all of the electronic components 110 are normal, a next manufacturing process (for example, forming the driving circuits 120 and 130) or packaging of the electronic device 100 may be performed, which is not limited in the disclosure. Therefore, the manufacturing method of the embodiment may automatically determine whether the electronic components 110 in the electronic device 100 are failed during the manufacturing process, so that the electronic components determined to be failed may be repaired during the manufacturing process, so as to effectively improve a manufacturing yield of the electronic device 100.

Figure 3:
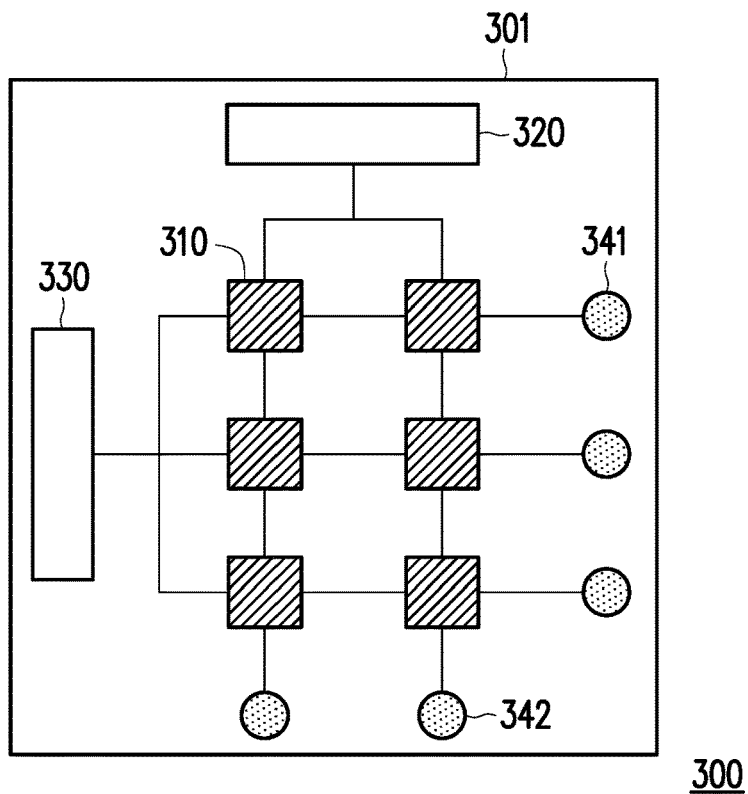
FIG. 3 is a schematic structural diagram of an electronic device according to an embodiment of the disclosure.

FIG. 3 is a schematic structural diagram of an electronic device according to an embodiment of the disclosure. Referring to FIG. 3, FIG. 3 may be a top view of an electronic device 300, and may represent a (product) structure of the electronic device 300 after the manufacturing process is completed. In the embodiment, the electronic device 300 includes a substrate 301, a plurality of electronic components 310, driving circuits 320 and 330 and a plurality of test pads 341 and 342. In the embodiment, the plurality of electronic components 310 are arranged on the substrate 301 in an array, and are electrically connected to the driving circuits 320 and 330 and the plurality of test pads 341 and 342 through a plurality of traces. Compared with FIG. 1, the plurality of test pads 341 and 342 of the embodiment are respectively formed on the substrate 301 at positions of two side edges different from that of the driving circuits 320 and 330. Moreover, it should be noted that the driving circuits 320 and 330 and the plurality of test pads 341 and 342 are formed on the substrate 301. After the electronic device 300 completes and passes the test of step S230 as described in the above embodiment of FIG. 2, the plurality of test pads 341 and 342 may be remained on the substrate 301.

Figure 4:
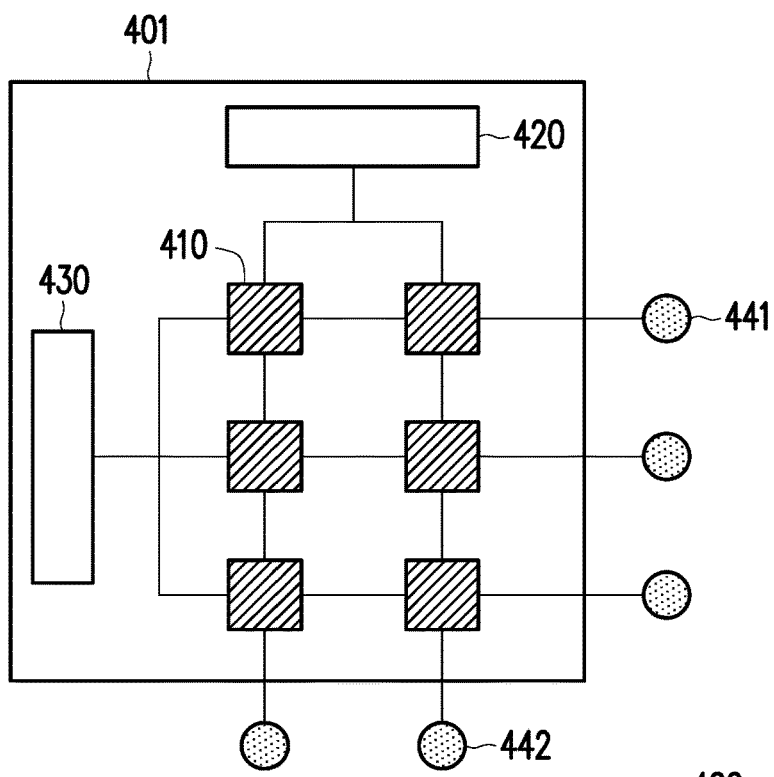
FIG. 4 is a schematic structural diagram of an electronic device according to an embodiment of the disclosure.

FIG. 4 is a schematic structural diagram of an electronic device according to an embodiment of the disclosure. Referring to FIG. 4, FIG. 4 may be a top view of an electronic device 400, and may represent a (product) structure of the electronic device 400 after the manufacturing process is completed. In the embodiment, the electronic device 400 includes a substrate 401, a plurality of electronic components 410, driving circuits 420 and 430 and a plurality of test pads 441 and 442. In the embodiment, the plurality of electronic components 410 are arranged on the substrate 401 in an array, and are electrically connected to the driving circuits 420 and 430 and the plurality of test pads 441 and 442 through a plurality of traces. Compared with FIG. 3, based on requirements of product specifications (i.e., limited by a requirement on substrate area), after the electronic device 400 completes and passes the test of step S230 as described in the above embodiment of FIG. 2, the plurality of test pads 441, 442 are removed. In other words, the plurality of test pads 441, 442 may be formed on the substrate 401 or other substrates before substrate dicing.

Figure 5:
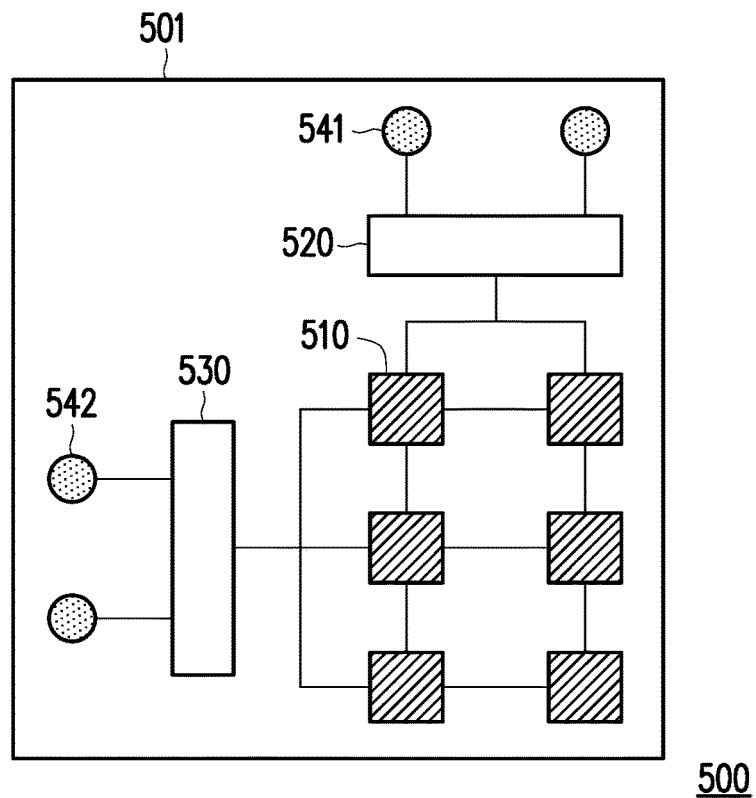
FIG. 5 is a schematic structural diagram of an electronic device according to an embodiment of the disclosure.

FIG. 5 is a schematic structural diagram of an electronic device according to an embodiment of the disclosure. Referring to FIG. 5, FIG. 5 may be a top view of an electronic device 500, and may represent a (product) structure of the electronic device 500 after the manufacturing process is completed. In the embodiment, the electronic device 500 includes a substrate 501, a plurality of electronic components 510, driving circuits 520 and 530 and a plurality of test pads 541 and 542. In the embodiment, the plurality of electronic components 510 are arranged on the substrate 501 in an array, and are electrically connected to the driving circuits 520 and 530 and the plurality of test pads 541 and 542 through a plurality of traces. Compared with FIG. 1, the plurality of test pads 541 and 542 of the embodiment are respectively formed on the substrate 501 at positions of two side edges that are the same with that of the driving circuits 520 and 530, and are electrically connected to the plurality of electronic components 510 through the driving circuits 520 and 530. It should be noted that the driving circuits 520 and 530 and the plurality of test pads 541 and 542 are formed on the substrate 501. After the electronic device 500 completes and passes the test of step S230 as described in the above embodiment of FIG. 2, the plurality of test pads 541 and 542 may be remained on the substrate 501.

Figure 6:
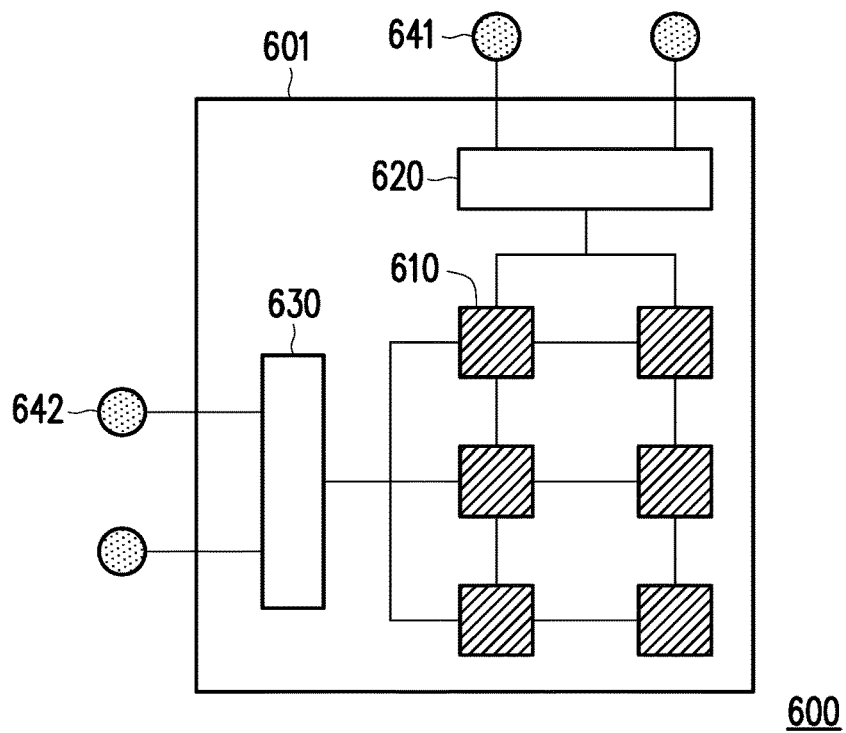
FIG. 6 is a schematic structural diagram of an electronic device according to an embodiment of the disclosure.

FIG. 6 is a schematic structural diagram of an electronic device according to an embodiment of the disclosure. Referring to FIG. 6, FIG. 6 may be a top view of an electronic device 600, and may represent a (product) structure of the electronic device 600 after the manufacturing process is completed. In the embodiment, the electronic device 600 includes a substrate 601, a plurality of electronic components 610, driving circuits 620 and 630 and a plurality of test pads 641 and 642. In the embodiment, the plurality of electronic components 610 are arranged on the substrate 601 in an array, and are electrically connected to the driving circuits 620 and 630 and the plurality of test pads 641 and 642 through a plurality of traces. Compared with FIG. 5, based on requirements of product specifications (i.e., limited by a requirement on substrate area), after the electronic device 600 completes and passes the test of step S230 as described in the above embodiment of FIG. 2, the plurality of test pads 641, 642 are removed. In other words, the plurality of test pads 641, 642 may be formed on the substrate 601 or other substrates before substrate dicing.

Figure 7:
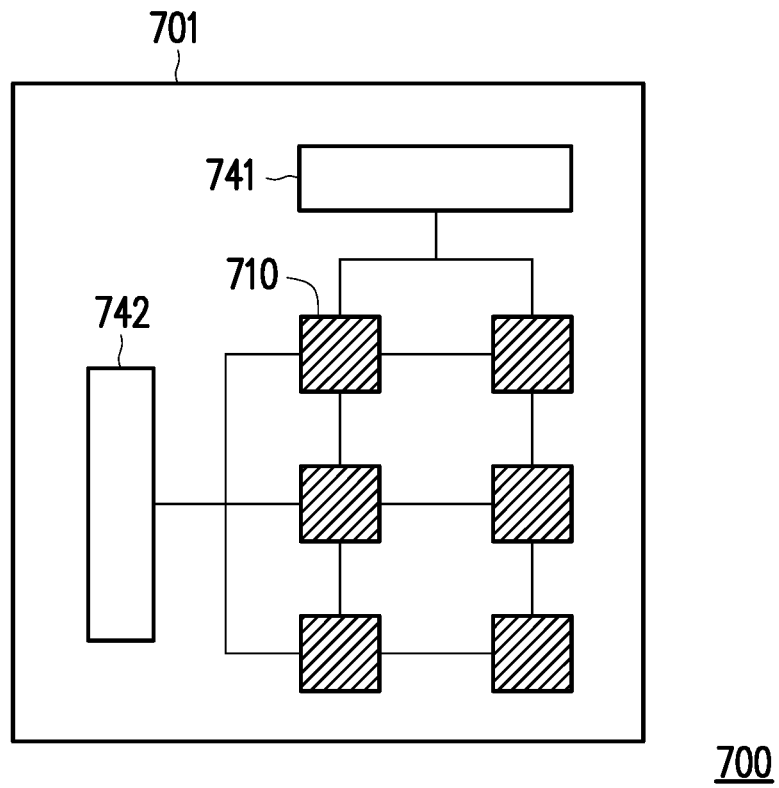
FIG. 7 is a schematic structural diagram of an electronic device according to an embodiment of the disclosure.

FIG. 7 is a schematic structural diagram of an electronic device according to an embodiment of the disclosure. Referring to FIG. 7, FIG. 7 may be a top view of an electronic device 700, and may represent a (product) structure of the electronic device 700 after the manufacturing process is completed. In the embodiment, the electronic device 700 includes a substrate 701, a plurality of electronic components 710 and a plurality of test pads 741 and 742. In the embodiment, the plurality of electronic components 710 are arranged on the substrate 701 in an array, and are electrically connected to the plurality of test pads 741 and 742 through a plurality of traces. Compared with FIG. 1, the plurality of test pads 741 and 742 of the embodiment are respectively formed on the substrate 701 and correspond to the positions of the driving circuits. It should be noted that after the electronic device 700 completes and passes the test of step S230 as described in the above embodiment of FIG. 2, the plurality of test pads 741 and 742 may be used as bonding pads and remained on the substrate 701, and the driving circuit are formed on the plurality of test pads 741, 742. The driving circuit may be electrically connected to the plurality of electronic components 710 through the plurality of test pads 741 and 742. In other words, the bonding pads formed during the manufacturing process of the electronic device 700 for bonding the driving circuits may be first used to test whether the plurality of electronic components 710 are normal or failed, and then used for bonding with the substrate 701 when the driving circuits are formed on the substrate 701, so as to be electrically connected to the plurality of electronic components 710 through corresponding circuit traces.

Figure 8:
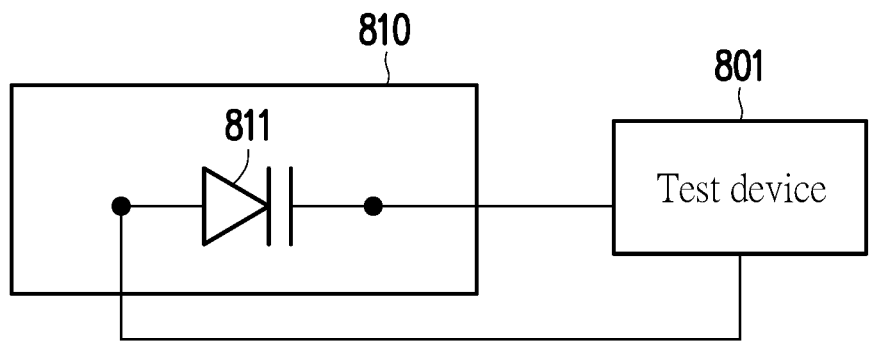
FIG. 8 is a schematic circuit diagram of an electronic component according to an embodiment of the disclosure.

FIG. 8 is a schematic circuit diagram of an electronic component according to an embodiment of the disclosure. Referring to FIG. 8, the electronic component of the above embodiments may be implemented by an electronic component 810 as shown in FIG. 8. In the embodiment, the electronic component 810 may include a variable capacitor 811. A test device 801 may be electrically connected to an anode and a cathode of the variable capacitor 811 through the test pad, and may apply a forward bias to the variable capacitor 811 through the test pad, so that the variable capacitor 811 may realize a diode function, so as to emit light (electromagnetic wave) with a specific wavelength (for example, 0.2-1000 μm). In the embodiment, the electronic component 810 may further include other circuit traces (not shown), so as to be electrically connected to the driving circuits. In the embodiment, whether the variable capacitor 811 of the electronic component 810 emits light with the specific wavelength may be detected by a light detection component, so as to determine whether the variable capacitor 811 of the electronic component 810 is normal or failed. The light with the specific wavelength is emitted by the variable capacitor 811. Alternatively, in an embodiment, an infrared imager may be used to detect whether the circuit traces and the variable capacitor 811 of the electronic component 810 have normal thermal characteristics (heat distribution), so as to determine whether the variable capacitor 811 of the electronic component 810 is normal or failed (including determining whether the variable capacitor 811 and the circuit traces are normally electrically connected). The test device 801 may be a device that may provide a test voltage and/or a test current, and the test device 801 may apply a forward bias and/or a reverse bias to the electronic component 810 based on a configuration result of the traces. However, the configuration method of the traces is not limited by the disclosure.

Figure 9:
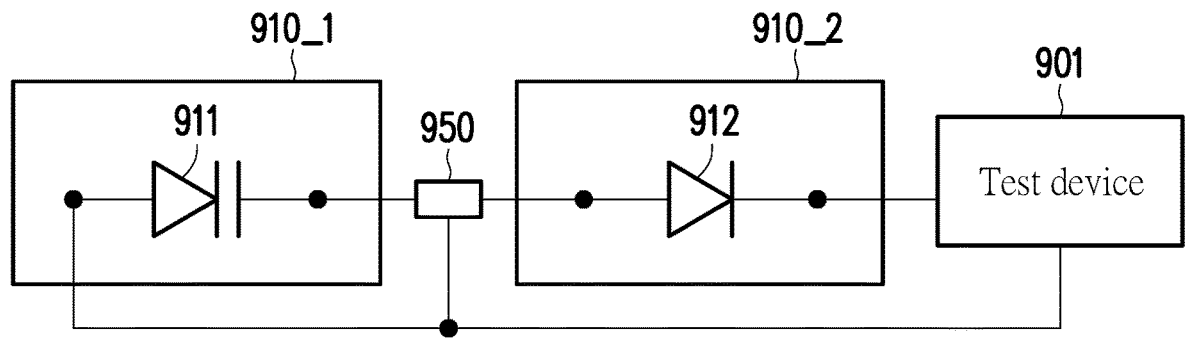
FIG. 9 is a schematic circuit diagram of electronic components according to an embodiment of the disclosure.

FIG. 9 is a schematic circuit diagram of electronic components according to an embodiment of the disclosure. Referring to FIG. 9, two adjacent electronic components in the above embodiments may be implemented as two electronic components 910_1 and 910_2 as shown in FIG. 9. In the embodiment, the electronic component 910_1 may include a variable capacitor 911. The electronic component 910_2 may include a light-emitting diode 912. A circuit component 950 may also be included on a circuit trace between the electronic component 910_1 and the electronic component 910_2. The variable capacitor 911, the light-emitting diode 912 and the circuit component 950 may be electrically connected in series. The circuit component 950 may be, for example, composed of related components such as inductors, resistors, transistors and/or capacitors, which is not limited by the disclosure. A test device 901 may be electrically connected to anodes and the cathodes of the variable capacitor 911 and the light-emitting diode 912 through the test pads, and may apply a forward bias to the variable capacitor 911 and the light-emitting diode 912 through the test pads, so that the variable capacitor 911 may realize a diode function to emit light (electromagnetic wave) with a specific wavelength (for example, 0.2-1000 μm), and the light-emitting diode 912 may emit light of another wavelength (for example, 350-800 μm). Alternatively, the test device 901 may apply a reverse bias to the variable capacitor 911 through the test pad to test a capacitance modulation function of the variable capacitor 911. In the embodiment, the electronic component 910_1 may further include other circuit traces (not shown), so as to be electrically connected to the driving circuits.

In the embodiment, the light detection component may be used to detect whether the variable capacitor 911 of the electronic component 910_1 emits light with a specific wavelength, or detect whether the light-emitting diode 912 of the electronic component 910_2 emits light of another wavelength (if the light with the specific wavelength emitted by the variable capacitor 911 is not easy to detect), so as to determine whether the variable capacitor 911 of the electronic component 910_1 is normal or failed. Alternatively, in an embodiment, an infrared imager may be used to detect whether the circuit traces and the variable capacitor 911 of the electronic component 910_1 have normal thermal characteristics (heat distribution), so as to determine whether the variable capacitor 911 of the electronic component 910_1 is normal or failed (including determining whether the variable capacitor 911 and the circuit traces are normally electrically connected). The test device 901 may be a device that may provide a test voltage and/or a test current, and the test device 901 may apply a forward bias and/or a reverse bias to the electronic components 910_1 and 910_2 based on a configuration result of the traces and the circuit component 950. However, the configuration method of the traces and the circuit component 950 is not limited by the disclosure.

Figure 10:
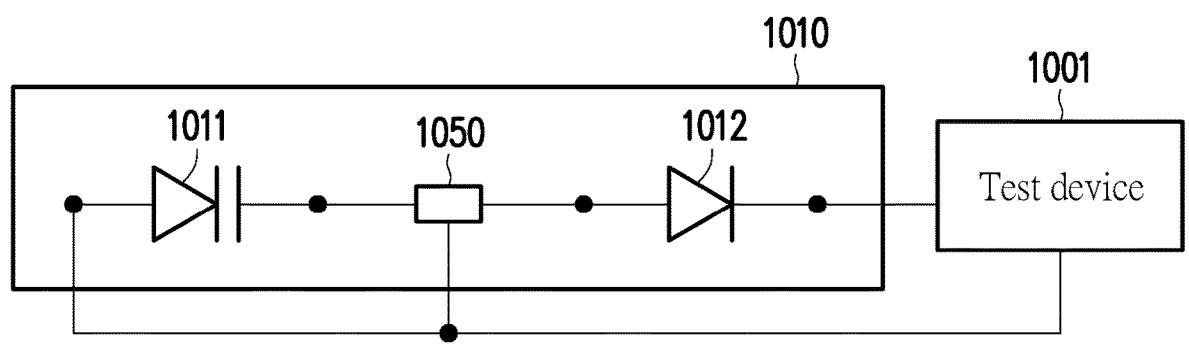
FIG. 10 is a schematic circuit diagram of electronic components according to an embodiment of the disclosure.

FIG. 10 is a schematic circuit diagram of electronic components according to an embodiment of the disclosure. Referring to FIG. 10, the electronic component in the above embodiments may be implemented by an electronic component 1010 as shown in FIG. 10. In the embodiment, the electronic component 1010 may include a variable capacitor 1011 and a light-emitting diode 1012 electrically connected to the variable capacitor 1011 in series, and a circuit trace between the variable capacitor 1011 and the light-emitting diode 1012 may further include a circuit component 1050. The variable capacitor 1011, the light-emitting diode 1012 and the circuit component 1050 may be electrically connected in series. A test device 1001 may be electrically connected to anodes and the cathodes of the variable capacitor 1011 and the light-emitting diode 1012 through the test pads, and may apply a forward bias to the variable capacitor 1011 and the light-emitting diode 1012 through the test pads, so that the variable capacitor 1011 may realize a diode function to emit light (electromagnetic wave) with a specific wavelength (for example, 0.2-1000 μm), and the light-emitting diode 1012 may emit light of another wavelength (for example, 350-800 μm). Alternatively, the test device 1001 may apply a reverse bias to the variable capacitor 1011 through the test pad to test a capacitance modulation function of the variable capacitor 1011. In the embodiment, the electronic component 1010 may further include other circuit traces (not shown), so as to be electrically connected to the driving circuits.

In the embodiment, the light detection component may be used to detect whether the variable capacitor 1011 of the electronic component 1010 emits light with a specific wavelength, or detect whether the light-emitting diode 1012 of the electronic component 1010 emits light of another wavelength (if the light with the specific wavelength emitted by the variable capacitor 1011 is not easy to detect), so as to determine whether the variable capacitor 1011 of the electronic component 1010 is normal or failed. Alternatively, in an embodiment, an infrared imager may be used to detect whether the circuit traces and the variable capacitor 1011 of the electronic component 1010 have normal thermal characteristics (heat distribution), so as to determine whether the variable capacitor 1011 of the electronic component 1010 is normal or failed (including determining whether the variable capacitor 1011 and the circuit traces are normally electrically connected). The test device 1001 may be a device that may provide a test voltage and/or a test current, and the test device 1001 may apply a forward bias and/or a reverse bias to the electronic component 1010 based on a configuration result of the traces and the circuit component 1050. However, the configuration method of the traces and the circuit component 1050 is not limited by the disclosure.

Figure 11:
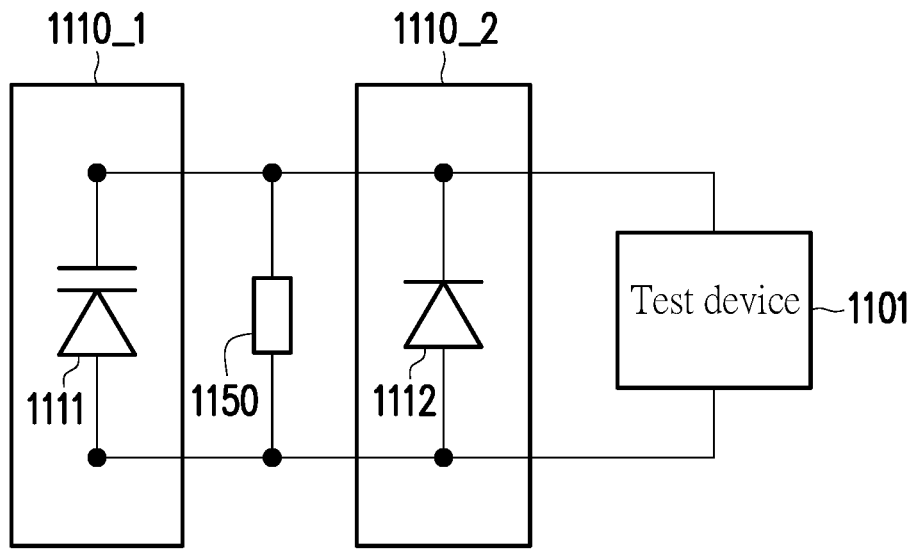
FIG. 11 is a schematic circuit diagram of electronic components according to an embodiment of the disclosure.

FIG. 11 is a schematic circuit diagram of electronic components according to an embodiment of the disclosure. Referring to FIG. 11, two adjacent electronic components in the above embodiments may be implemented by two electronic components 1110_1 and 1110_2 as shown in FIG. 11. In the embodiment, the electronic component 1110_1 may include a variable capacitor 1111. The electronic component 1110_2 may include a light-emitting diode 1112. A circuit component 1150 may also be included on a circuit trace between the electronic component 1110_1 and the electronic component 1110_2. The variable capacitor 1111, the light-emitting diode 1112 and the circuit component 1150 may be electrically connected in parallel. A test device 1101 may be electrically connected to anodes and the cathodes of the variable capacitor 1111 and the light-emitting diode 1112 through the test pads, and may apply a forward bias to the variable capacitor 1111 and the light-emitting diode 1112 through the test pads, so that the variable capacitor 1111 may realize a diode function to emit light (electromagnetic wave) with a specific wavelength (for example, 0.2-1000 μm), and the light-emitting diode 1112 may emit light of another wavelength (for example, 350-800 μm). Alternatively, the test device 1101 may apply a reverse bias to the variable capacitor 1111 through the test pad to test a capacitance modulation function of the variable capacitor 1111. In the embodiment, the electronic component 1110_1 may further include other circuit traces (not shown), so as to be electrically connected to the driving circuits.

In the embodiment, the light detection component may be used to detect whether the variable capacitor 1111 of the electronic component 1110_1 emits light with a specific wavelength, or detect whether the light-emitting diode 1112 of the electronic component 1110_2 emits light of another wavelength (if the light with the specific wavelength emitted by the variable capacitor 1111 is not easy to detect), so as to determine whether the variable capacitor 1111 of the electronic component 1110_1 is normal or failed. Alternatively, in an embodiment, an infrared imager may be used to detect whether the circuit traces and the variable capacitor 1111 of the electronic component 1110_1 have normal thermal characteristics (heat distribution), so as to determine whether the variable capacitor 1111 of the electronic component 1110_1 is normal or failed (including determining whether the variable capacitor 1111 and the circuit traces are normally electrically connected). The test device 1101 may be a device that may provide a test voltage and/or a test current, and the test device 1101 may apply a forward bias and/or a reverse bias to the electronic components 1110_1 and 1110_2 based on a configuration result of the traces and the circuit component 1150. However, the configuration method of the traces and the circuit component 1150 is not limited by the disclosure.

Figure 12:
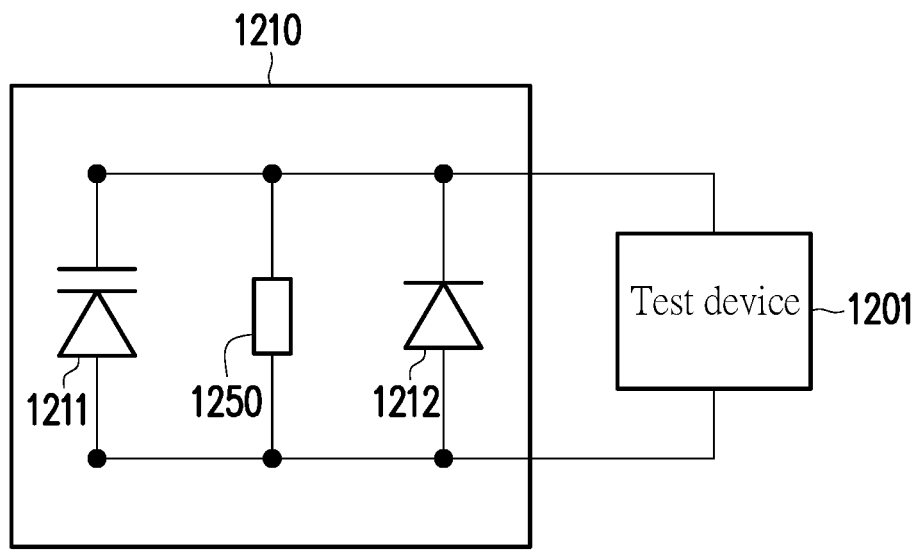
FIG. 12 is a schematic circuit diagram of electronic components according to an embodiment of the disclosure.

FIG. 12 is a schematic circuit diagram of electronic components according to an embodiment of the disclosure. Referring to FIG. 12, the electronic component in the above embodiments may be implemented by an electronic component 1210 as shown in FIG. 12. In the embodiment, the electronic component 1210 may include a variable capacitor 1211 and a light-emitting diode 1212, and a circuit trace between the variable capacitor 1211 and the light-emitting diode 1212 may further include a circuit component 1250. The variable capacitor 1211, the light-emitting diode 1212 and the circuit component 1250 may be electrically connected in parallel. A test device 1201 may be electrically connected to anodes and the cathodes of the variable capacitor 1211 and the light-emitting diode 1212 through the test pads, and may apply a forward bias to the variable capacitor 1211 and the light-emitting diode 1212 through the test pads, so that the variable capacitor 1211 may realize a diode function to emit light (electromagnetic wave) with a specific wavelength (for example, 0.2-1000 μm), and the light-emitting diode 1212 may emit light of another wavelength (for example, 350-800 μm). Alternatively, the test device 1201 may apply a reverse bias to the variable capacitor 1211 through the test pad to test a capacitance modulation function of the variable capacitor 1211. In the embodiment, the electronic component 1210 may further include other circuit traces (not shown), so as to be electrically connected to the driving circuits.

In the embodiment, the light detection component may be used to detect whether the variable capacitor 1211 of the electronic component 1210 emits light with a specific wavelength, or detect whether the light-emitting diode 1212 of the electronic component 1210 emits light of another wavelength (if the light with the specific wavelength emitted by the variable capacitor 1211 is not easy to detect), so as to determine whether the variable capacitor 1211 of the electronic component 1210 is normal or failed. Alternatively, in an embodiment, an infrared imager may be used to detect whether the circuit traces and the variable capacitor 1211 of the electronic component 1210 have normal thermal characteristics (heat distribution), so as to determine whether the variable capacitor 1211 of the electronic component 1210 is normal or failed (including determining whether the variable capacitor 1211 and the circuit traces are normally electrically connected). The test device 1201 may be a device that may provide a test voltage and/or a test current, and the test device 1201 may apply a forward bias and/or a reverse bias to the electronic component 1210 based on a configuration result of the traces and the circuit component 1250. However, the configuration method of the traces and the circuit component 1250 is not limited by the disclosure.

Figure 13:
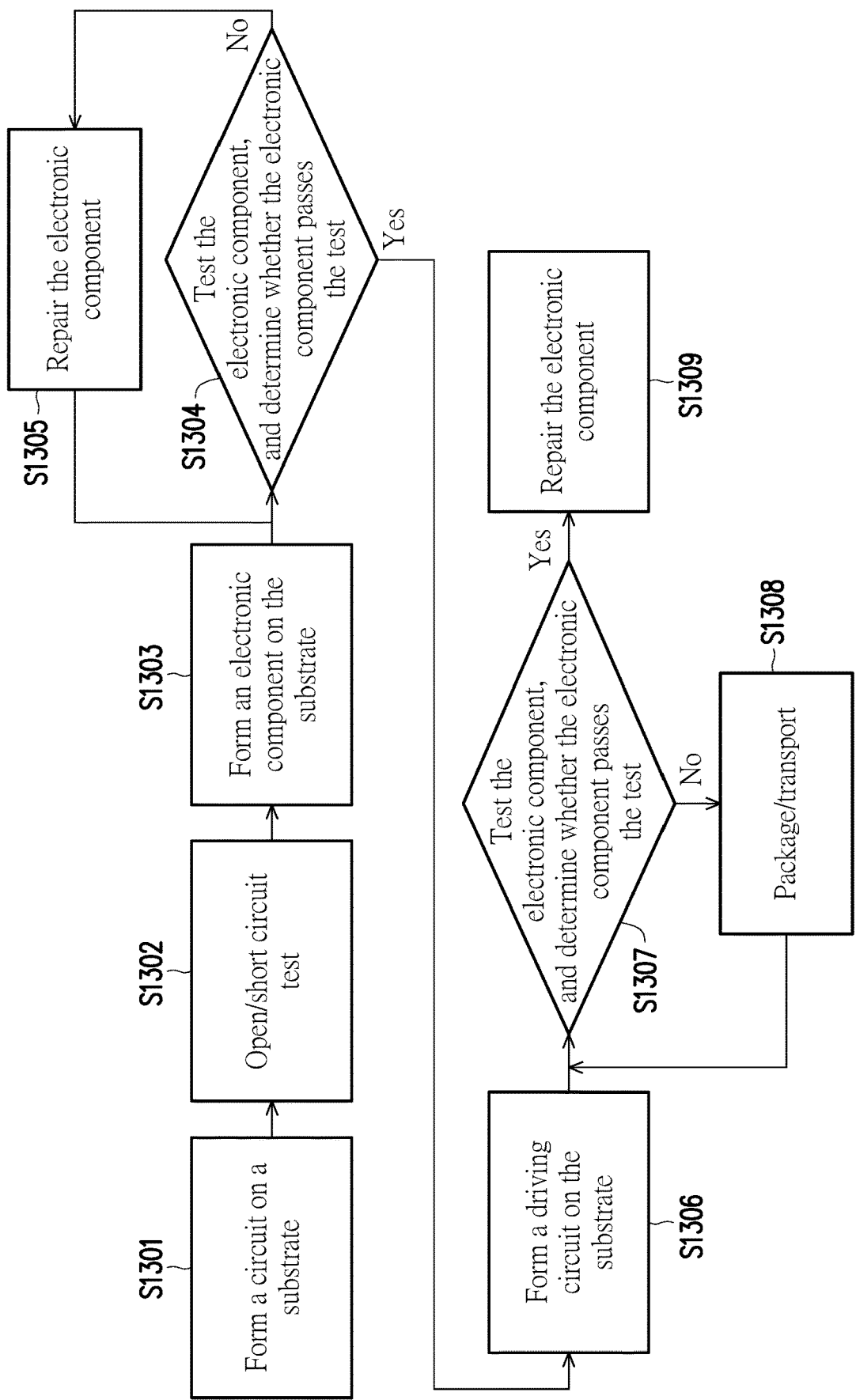
FIG. 13 is a flowchart of a manufacturing method of an electronic device according to another embodiment of the disclosure.

FIG. 13 is a flowchart of a manufacturing method of an electronic device according to another embodiment of the disclosure. The electronic devices of the above embodiments may be manufactured by performing following steps S1301 to S1309. Referring to FIG. 1 and FIG. 13, taking the electronic device 100 of FIG. 1 as an example, in step S1301, a circuit is formed on the substrate 101. A plurality of circuit traces (metal traces) and the plurality of test pads 140 may be first formed on the substrate 101. In step S1302, an open/short circuit test is performed on the circuit to determine whether the plurality of circuit traces and the plurality of test pads 140 are normally connected. In step S1303, the plurality of electronic components 110 are formed on the substrate 101. The plurality of electronic components 110 are electrically connected to the plurality of test pads 140 through the plurality of circuit traces. In step S1304, a bias is applied through the plurality of test pads 140 to test the plurality of electronic components 110, and it is determined whether the electronic components 110 pass the test. In this regard, for test details of step S1304, reference may be made to the relevant test description of applying the forward bias in step S230 in the above embodiment of FIG. 2, and details thereof are not repeated. If at least one of the plurality of electronic components 110 fails the test, step S1305 is executed. In step S1305, a manufacturing personnel or manufacturing equipment may repair the failed electronic components. If all of the plurality of electronic components 110 pass the test, step S1306 is executed. In step S1306, the driving circuits 120 and 130 are formed on the substrate 101. The driving circuits 120 and 130 are electrically connected to the plurality of electronic components 110 through the plurality of circuit traces.

In step S1307, a bias may be applied again through the plurality of test pads 140 to test the plurality of electronic components 110 again, and it is determined whether the electronic components 110 pass the test. In this regard, for test details of step S1304, reference may be made to the relevant test description of applying the forward bias in step S230 in the above embodiment of FIG. 2, or applying the reverse bias to test the capacitance modulation function, and details thereof are not repeated. If at least one of the plurality of electronic components 110 fails the test, step S1308 is executed. In step S1308, the manufacturing personnel or manufacturing equipment may repair the failed electronic components. If all of the plurality of electronic components 110 pass the test, step S1309 is executed. In step S1309, the electronic device 100 is packaged/transported. Therefore, the manufacturing method of the embodiment may automatically determine whether the electronic components 110 in the electronic device 100 are failed during the manufacturing process, so that the electronic components determined to be failed may be repaired during the manufacturing process, so as to effectively improve a manufacturing yield of the electronic device 100.

In some embodiments of the disclosure, an image sensing device such as an optical microscope (OM) or a scanning electron microscope (SEM) may be used to observe that the electronic device is configured with test pads and the light-emitting diode, or observe that the variable capacitor has a light-emitting diode structure inside.

In summary, the manufacturing method of the electronic device of the disclosure may detect whether the variable capacitor and/or light-emitting diode of the electronic component emit light by applying a forward bias to the electronic component, or detect whether the electronic component and the traces have normal heat distribution, so as to accurately and conveniently determine whether the variable capacitor is normal or failed. In addition, the manufacturing method of the electronic device of the disclosure may also test whether the capacitance modulation function of the variable capacitor is normal by applying a reverse bias to the variable capacitor of the electronic component.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A manufacturing method of an electronic device, comprising:
    providing a substrate;
    bonding at least one electronic component to the substrate, wherein the at least one electronic component is mainly driven by a reverse bias in an operating mode to implement a capacitance modulation function of the at least one electronic component;
    applying a forward bias to the at least one electronic component to test a diode function of the at least one electronic component and determining whether the at least one electronic component is normal or failed based on the diode function of the at least one electronic component; and
    transporting the substrate configured with the at least one electronic component determined to be normal to a next production site or repairing the at least one electronic component determined to be failed.

2. The manufacturing method of the electronic device according to claim 1, wherein the step of determining whether the at least one electronic component is normal or failed is based on light emitted by the at least one electronic component.

3. The manufacturing method of the electronic device according to claim 2, wherein the at least one electronic component comprises a variable capacitor, and the light is emitted from the variable capacitor.

4. The manufacturing method of the electronic device according to claim 3, wherein the at least one electronic component comprises a variable capacitor and a light-emitting diode electrically connected in series to the variable capacitor, and the light is emitted from the light-emitting diode.

5. The manufacturing method of the electronic device according to claim 3, wherein the electronic component comprises a variable capacitor and a light-emitting diode electrically connected in parallel with the variable capacitor, and the light is emitted from the light-emitting diode.

6. The manufacturing method of the electronic device according to claim 1, further comprising:
    forming a test pad, wherein the at least one electronic component is electrically connected to the test pad, and the at least one electronic component receives the forward bias through the test pad.

7. The manufacturing method of the electronic device according to claim 6, further comprising:
    using the test pad as a bonding pad, and forming a driving circuit on the test pad, wherein the driving circuit is electrically connected to the at least one electronic component through the test pad.

8. The manufacturing method of the electronic device according to claim 6, wherein the test pad is formed in a peripheral area of the substrate.

9. The manufacturing method of the electronic device according to claim 6, wherein after testing, the test pad is removed.

10. The manufacturing method of the electronic device according to claim 6, wherein after testing, the test pad is remained.

11. The manufacturing method of the electronic device according to claim 6, further comprising:
    forming a driving circuit on the substrate,
    wherein the test pad is formed on the substrate and at a position of a side edge different from where the driving circuit is located.

12. The manufacturing method of the electronic device according to claim 6, further comprising:
    forming a driving circuit on the substrate,
    wherein the test pad is formed on the substrate and at a position of a side edge the same as where the driving circuit is located, and the test pad is electrically connected to the at least one electronic component through the driving circuit.

13. The manufacturing method of the electronic device according to claim 6, wherein the at least one electronic component is arranged in an active area of the substrate in an array.

14. The manufacturing method of the electronic device according to claim 6, wherein the at least one electronic component is arranged in an active area of the substrate in random arrangement and connection.

15. The manufacturing method of the electronic device according to claim 6, further comprising:
    forming a circuit trace on the substrate,
    wherein the circuit trace is electrically connected to the at least one electronic component and the test pad.

16. The manufacturing method of the electronic device according to claim 15, further comprising:
    performing at least one of an open circuit test and a short circuit test on the circuit trace to determine whether the circuit trace and the test pad are normally connected.

17. The manufacturing method of the electronic device according to claim 15, further comprising:
    forming a circuit component on the circuit trace.

* * * * *